(12) United States Patent
Takahashi et al.

(10) Patent No.: US 10,425,726 B2
(45) Date of Patent: Sep. 24, 2019

(54) SIGNAL PROCESSING DEVICE, SIGNAL PROCESSING METHOD, AND PROGRAM

(71) Applicant: Sony Corporation, Tokyo (JP)

(72) Inventors: Masafumi Takahashi, Kanagawa (JP); Atsushi Izumihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/769,503

(22) PCT Filed: Oct. 12, 2016

(86) PCT No.: PCT/JP2016/080222
§ 371 (c)(1),
(2) Date: Apr. 19, 2018

(87) PCT Pub. No.: WO2017/073324
PCT Pub. Date: May 4, 2017

(65) Prior Publication Data
US 2018/0310097 A1    Oct. 25, 2018

(30) Foreign Application Priority Data
Oct. 26, 2015  (JP) .................................. 2015-209551

(51) Int. Cl.
*H04R 3/00* (2006.01)
*H04N 7/15* (2006.01)
(Continued)

(52) U.S. Cl.
CPC ................ *H04R 3/005* (2013.01); *G01S 5/30* (2013.01); *G01S 19/51* (2013.01); *H03G 3/3005* (2013.01);
(Continued)

(58) Field of Classification Search
None
See application file for complete search history.

(56) References Cited

U.S. PATENT DOCUMENTS

| 2002/0097885 A1* | 7/2002 | Birchfield | H04R 1/406 |
| | | | 381/92 |
| 2012/0076316 A1* | 3/2012 | Zhu | H04R 3/005 |
| | | | 381/71.11 |

(Continued)

FOREIGN PATENT DOCUMENTS

| EP | 1202603 A1 | 5/2002 |
| JP | 07-193798 A | 7/1995 |

(Continued)

OTHER PUBLICATIONS

International Search Report and English translation thereof dated Dec. 27, 2016 in connection with International Application No. PCT/JP2016/080222.

(Continued)

*Primary Examiner* — Curtis A Kuntz
*Assistant Examiner* — Kenny H Truong
(74) *Attorney, Agent, or Firm* — Wolf, Greenfield & Sacks, P.C.

(57) ABSTRACT

The present technology relates to a signal processing device, a signal processing method, and a program that can provide sound with more increase in realistic sense by restoring a difference of sound pressure between sound sources.

The signal processing device includes: an acoustic signal obtaining unit that obtains an acoustic signal; a sound source positional information obtaining unit that obtains sound source positional information relating to a distance between a sound source and a sound collecting unit that collects sound from the sound source; a listening positional information obtaining unit that obtains listening positional information relating to a distance between a reproducing device that reproduces the acoustic signal and a listener who listens to sound reproduced by the reproducing device; and a correcting unit that corrects gain of the acoustic signal on a basis of the sound-source positional information and the (Continued)

listening positional information. The present technology can be applied to, e.g., a TV telephone system.

16 Claims, 7 Drawing Sheets

(51) Int. Cl.

| | |
|---|---|
| *H04S 7/00* | (2006.01) |
| *H04R 3/12* | (2006.01) |
| *G01S 5/30* | (2006.01) |
| *G01S 19/51* | (2010.01) |
| *H03G 3/30* | (2006.01) |
| *H04N 7/14* | (2006.01) |
| *H04R 1/40* | (2006.01) |
| *H04L 29/06* | (2006.01) |
| *H04M 3/56* | (2006.01) |

(52) U.S. Cl.
CPC ............... *H04N 7/147* (2013.01); *H04N 7/15* (2013.01); *H04R 1/406* (2013.01); *H04R 3/12* (2013.01); *H04S 7/302* (2013.01); *H04L 65/403* (2013.01); *H04M 3/568* (2013.01); *H04R 2203/12* (2013.01); *H04R 2430/01* (2013.01); *H04R 2430/20* (2013.01); *H04S 2400/13* (2013.01); *H04S 2400/15* (2013.01)

(56) References Cited

U.S. PATENT DOCUMENTS

| | | | | |
|---|---|---|---|---|
| 2014/0337016 | A1* | 11/2014 | Herbig .................. | H04M 3/568 704/201 |
| 2016/0174011 | A1* | 6/2016 | Rider ...................... | H04S 7/303 381/303 |

FOREIGN PATENT DOCUMENTS

| | | | |
|---|---|---|---|
| JP | 2007-274462 | A | 10/2007 |
| JP | 2008-017126 | A | 1/2008 |
| JP | 2009-246528 | A | 10/2009 |
| JP | 4518729 | B2 | 8/2010 |
| JP | 4882757 | B2 | 2/2012 |
| WO | WO 01/99469 | A1 | 12/2001 |

OTHER PUBLICATIONS

Ando A., Research Trend of Acoustic System based on Physical Acoustic Model, NHK, R&D No. 126/2011.3, 32 pages (including English translation).
Written Opinion and English translation thereof dated Dec. 27, 2016 in connection with International Application No. PCT/JP2016/080222.
International Preliminary Report on Patentability and English translation thereof dated May 11, 2018 in connection with International Application No. PCT/JP2016/080222.

* cited by examiner

SIGNAL PROCESSING DEVICE, SIGNAL PROCESSING METHOD, AND PROGRAM

CROSS-REFERENCE TO RELATED APPLICATIONS

This application claims the benefit under 35 U.S.C. § 371 as a U.S. National Stage Entry of International Application No. PCT/JP2016/080222, filed in the Japanese Patent Office as a Receiving Office on Oct. 12, 2016, which claims priority to Japanese Patent Application Number JP2015-209551, filed in the Japanese Patent Office on Oct. 26, 2015, each of which is hereby incorporated by reference in its entirety.

TECHNICAL FIELD

The present technology relates to a signal processing device, a signal processing method, and a program and more particularly, relates to a signal processing device, a signal processing method, and a program preferable for use in a case where more realistic sense can be obtained by restoring a relationship of a sound pressure difference between sound sources.

BACKGROUND ART

In recent years, systems called a TV telephone system and a TV conference system have been widespread. For example, in the TV telephone system and the TV conference system, users at remote places can talk to each other by viewing a video image.

For example, in the TV conference system, at two individual mutually distant places, devices for voice conference are provided. The device for voice conference on a sending side collects generated sound from different directions via a plurality of microphones and sends voice signals to the device for voice conference on a partner side. On the other hand, the device for voice conference on a receiving side receives the voice signals collected by the device for voice conference on the partner side and releases the sound from a speaker.

For example, Patent Literature 1 to 3 and Non-Patent Literature 1 propose that the control to obtain more realistic sense is performed in the TV conference system and the TV telephone system.

CITATION LIST

Patent Literature

Patent Literature 1: JP 4882757B
Patent Literature 2: JP 2007-274462A
Patent Literature 3: JP 4518729B

Non-Patent Literature

Non-Patent Literature 1: "Research Trend of Acoustic System Based on Physical Acoustic Model" by Akio Ando, NHK Science & Technology Research Laboratories R&D/No. 126/2011.3

DISCLOSURE OF INVENTION

Technical Problem

In a case where users at remote places communicate with each other in a TV telephone system and an acoustic field on the sending side is reproduced on the receiving side in order to improve the realistic sense, for example, application of a wave field synthesis technology is considered. However, when the wave field synthesis technology is used, a large number of microphones and speakers are required, costs can thus be increased, and the device scale is large.

In various scenes, the improvement in realistic sense is desired and a proposal of a more-easily-introduced technology is desired to enable the improvement in the realistic sense in viewpoint of the costs and the device scale.

The present technology has been made in view of such a situation, and makes it possible to obtain the realistic sense as if users at distant places exist at the same place.

Solution to Problem

According to one aspect of the present technology, a first signal processing device includes: an acoustic signal obtaining unit that obtains an acoustic signal; a sound source positional information obtaining unit that obtains sound source positional information relating to a distance between a sound source and a sound collecting unit that collects sound from the sound source; a listening positional information obtaining unit that obtains listening positional information relating to a distance between a reproducing device that reproduces the acoustic signal and a listener who listens to sound reproduced by the reproducing device; and a correcting unit that corrects gain of the acoustic signal on a basis of the sound-source positional information and the listening positional information.

The correcting unit may correct the gain of the acoustic signal, thereby restoring a relationship of a difference of sound pressure between a plurality of sound sources.

In a case where the distance shown by the sound-source positional information is a distance $r_1$ and the distance shown by the listening positional information is a distance $r_2$, the correcting unit may multiply the acoustic signal by $(r_1 \cdot r_2)/(r_1+r_2)$.

The distance shown by the listening positional information may have a fixed value.

The acoustic signal obtaining unit may obtain the acoustic signal via a network. The sound-source positional information obtaining unit may obtain the sound-source positional information via a network.

The listening positional information obtaining unit may obtain the listening positional information via a network.

In a case where there is a plurality of listeners, the listening positional information may be an average value of distances between of the respective listeners and the reproducing device, a distance to a listener existing at the closest position to the reproducing device among the plurality of the listeners, or a fixed value.

According to one aspect of the present technology, a first signal processing method includes steps of: obtaining an acoustic signal; obtaining sound-source positional information relating to a distance between a sound source and a sound collecting unit that collects sound from the sound source; obtaining listening positional information relating to a distance between a reproducing device that reproduces the acoustic signal and a listener who listens to sound reproduced by the reproducing device; and correcting gain of the acoustic signal on a basis of the sound-source positional information and the listening positional information.

According to one aspect of the present technology, a first program for causing a computer to execute processing includes steps of: obtaining an acoustic signal; obtaining sound-source positional information relating to a distance between a sound source and a sound collecting unit that collects sound from the sound source; obtaining listening positional information relating to a distance between a reproducing device that reproduces the acoustic signal and a listener who listens to sound reproduced by the reproducing device; and correcting gain of the acoustic signal on a basis of the sound-source positional information and the listening positional information.

According to one aspect of the present technology, a second signal processing device includes: a sound collecting unit that collects sound from a sound source; a distance measuring unit that measures a distance between the sound source and the sound collecting unit; a listening positional information obtaining unit that obtains listening positional information relating to a distance between a reproducing device that reproduces an acoustic signal of the sound collected by the sound collecting unit and a listener who listens to sound reproduced by the reproducing device; and a correcting unit that corrects gain of the acoustic signal on a basis of the distance measured by the distance measuring unit and the distance shown by the listening positional information.

The acoustic signal corrected by the correcting unit may be supplied to the reproducing device.

The sound collecting unit may include a microphone array. The distance measuring unit may calculate mutual correlation of sound collected by the microphone array, and measure a distance to the sound source by using a distance between microphones that collect sound with high correlation.

The distance measuring unit may analyze an image obtained by capturing an image of the sound source and measures a distance to the sound source.

The distance measuring unit may measure a distance between the sound source and the sound collecting unit by using a GPS.

The sound collecting unit may include a microphone that collects sound in proximity of the sound source. The distance measuring unit may set a predetermined position as a reference, and measure a distance between the predetermined position and the microphone.

According to one aspect of the present technology, a second signal processing method includes steps of: collecting sound form a sound source; measuring a distance between the sound source and a sound collecting unit that collects the sound; obtaining listening positional information relating to a distance between a reproducing device that reproduces an acoustic signal of the collected sound and a listener who listens to sound reproduced by the reproducing device; and correcting gain of the acoustic signal on a basis of the measured distance and the distance shown by the listening positional information.

According to one aspect of the present technology, there is provided a second program for causing a computer to execute processing including steps of: collecting sound from a sound source; measuring a distance between the sound source and a sound collecting unit that collects the sound; obtaining listening positional information relating to a distance between a reproducing device that reproduces an acoustic signal of the collected sound and a listener who listens to sound reproduced by the reproducing device; and correcting gain of the acoustic signal on a basis of the measured distance and the distance shown by the listening positional information.

In the first signal processing device, signal processing method, and program according to the one aspect of the present technology: an acoustic signal is obtained; sound-source positional information relating to a distance between a sound source and a sound collecting unit that collects sound from the sound source is obtained; listening positional information relating to a distance between a reproducing device that reproduces the acoustic signal and a listener who listens to sound reproduced by the reproducing device is obtained; and gain of the acoustic signal is corrected on a basis of the sound-source positional information and the listening positional information.

In the second signal processing device, signal processing method, and program according to the one aspect of the present technology: sound form a sound source is collected; a distance between the sound source and a sound collecting unit that collects the sound is measured; listening positional information relating to a distance between a reproducing device that reproduces an acoustic signal of the collected sound and a listener who listens to sound reproduced by the reproducing device is obtained; and gain of the acoustic signal is corrected on a basis of the measured distance and the distance shown by the listening positional information.

Advantageous Effects of Invention

According to one aspect of the present technology, it is possible to obtain the realistic sense as if users at distant places exist at the same place.

Note that the advantageous effects described here are not necessarily limited and may be any of the advantageous effects described in the present disclosure.

MODE(S) FOR CARRYING OUT THE INVENTION

Figure 1:
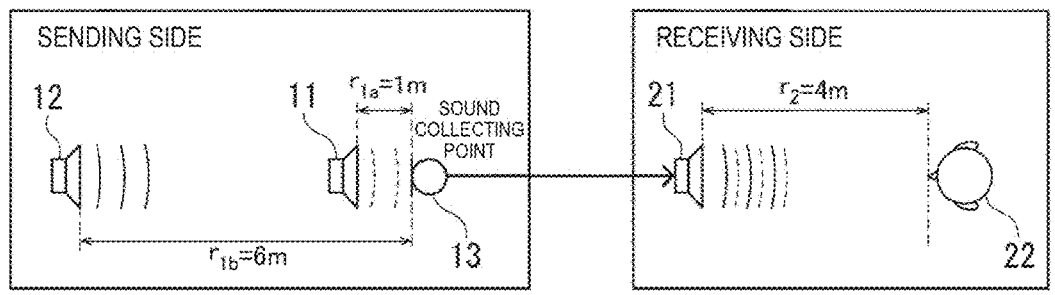
FIG. 1 is an illustration for explaining a configuration of an acoustic communication system.

Hereinbelow, a description will be given of an embodiment of the present technology (hereinbelow referred to as an embodiment). Note that the description will be given in the following order.

1. Regarding one factor that damages realistic sense
2. Configuration of acoustic communication system
3. Configurations and operations of sound source separating unit and distance measuring unit
4. Configuration and operation of sound pressure correcting unit
5. Regarding acoustic signal as correction target
6. Regarding recording medium <Regarding One Factor that Damages Realistic Sense>

The present technology can be applied to a system in a case where users at remote places communicate with each other via a network. Also, the present technology is applied, thereby enabling realistic sense to be obtained as if the users at distant places exist at the same place. That is, the present technology has such a concept of tele-presence for realizing the realistic sense as if partners at remote places exist at the same place, and can be applied to a technology of such tele-presence.

Figure 2:
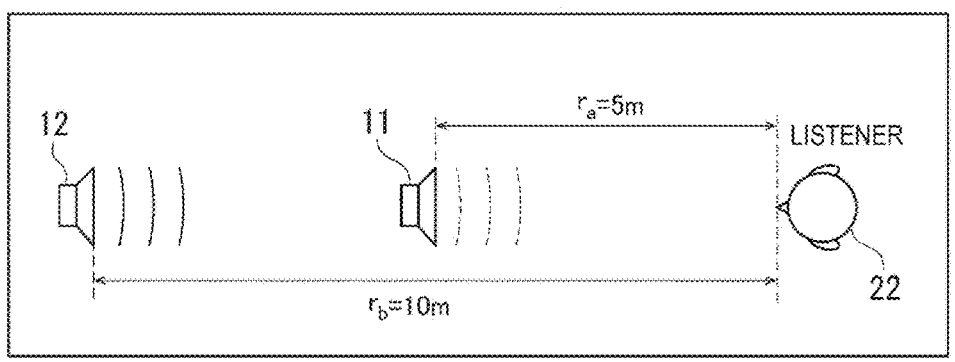
FIG. 2 is an illustration for explaining a reproducing situation in the acoustic communication system.

In order to mention the present technology with which the realistic sense is obtained, first, a description will be added to one factor that damages the realistic sense with reference to FIGS. 1 and 2.

FIG. 1 is an illustration showing an example of an acoustic communication system. A sending side includes a sound source 11, a sound source 12, and a sound collecting unit 13. The sound source 11 and the sound source 12 are persons, speakers, and the like. The sound collecting unit 13 is a microphone or the like, and collects sound from the sound source 11 and the sound source 12. The sound collected by the sound collecting unit 13 is sent to a receiving side via a network or the like.

The receiving side includes a reproduced sound source 21. The reproduced sound source 21 is a speaker or the like, and reproduces the sound sent from the sending side. A listener 22 listens to sound from the reproduced sound source 21.

Note that the following description will continue by assuming that all the sound sources are point sound sources. Even if the sound source is other than the point sound source, the present technology can be applied. Also, sound pressure of the sound generated by the point sound source is attenuated in inverse proportion to a distance. Therefore, sound volume (sound pressure) observed at a distance of 1 m from the point sound source is set to 1 in the following description and the sound volume is expressed with a ratio to the volume as 1.

As one factor that damages the realistic sense in such an acoustic communication system, there can be a difference of the sense of sound volume between the respective sound sources felt on the sending side and the receiving side. This will be described with reference to FIGS. 1 and 2.

In the acoustic communication system illustrated in FIG. 1, it is assumed that the sound collecting unit 13 and the sound source 11 on the sending side are apart from each other by 1 m ($=r_{1\,a}$). Also, it is assumed that the sound collecting unit 13 and the sound source 12 on the sending side are apart from each other by 6 m ($=r_{1\,b}$). Further, it is assumed that the reproduced sound source 21 and the listener 22 on the receiving side are apart from each other by 4 m ($=r_2$).

In a case where the sound collecting unit 13 and the reproduced sound source 21 are at the same point, in other words, the sound source 11, the sound source 12, the reproduced sound source 21, and the listener 22 are in the same space, a situation as illustrated in FIG. 2 is obtained. That is, the sound source 11 and the listener 22 are apart from each other by 5 m ($=1+4=r_{1\,a}+r_2=r_a$). Also similarly, the sound source 12 and the listener 22 are apart from each other by 10 m ($=6+4=r_{1\,b}+r_2=r_b$).

If the sound source 11, the sound source 12, the reproduced sound source 21, and the listener 22 exist in the same space, as illustrated in FIG. 2, the listener 22 listens to the sound from the sound source 11 at a position apart by 5 m ($=r_a$). Further, the listener 22 listens to the sound from the sound source 12 at a position apart by 10 m ($=r_b$).

Meanwhile, the sound pressure of the sound generated by the point sound source is attenuated in inverse proportion to the distance. Therefore, as illustrated in FIG. 2, in a case where the sound source and the listener 22 exist in the same space, the sound from the sound source 11 is propagated by 5 m to reach the listener 22. Thus, the sound reaches at sound pressure multiplied by ⅕. Also, since the sound from the sound source 12 is propagated by 10 m to reach the listener 22, the sound reaches at sound pressure multiplied by 1/10.

That is, in a case where the sound source 11 and the sound source 12 individually generate sound at the same sound volume, the sound of the sound source 12 at a position of the listener 22 is perceived as sound smaller than the sound of the sound source 11 by approximately 6 dB (=5/10).

On the other hand, in the acoustic communication system illustrated in FIG. 1, the sound from the sound source 11 is propagated by 1 m, is collected by the sound collecting unit 13, further is propagated by 4 m and reaches the listener 22 from the reproduced sound source 21. In this case, the sound from the sound source 11 is propagated by 1 m and reaches the sound collecting unit 13. Therefore, the sound reaches the sound collecting unit 13 at sound pressure multiplied by 1/1. The acoustic signal of the sound pressure multiplied by 1/1 is transmitted to the reproduced sound source 21 via the network or the like, further is propagated by 4 m from the reproduced sound source 21 and reaches the listener 22. Therefore, the sound from the sound source 11 reaches the listener 22 at the sound pressure multiplied by ¼ (=1/1×¼).

Also, in the acoustic communication system illustrated in FIG. 1, the sound from the sound source 12 is propagated by 6 m and is collected by the sound collecting unit 13, further is propagated by 4 m and reaches the listener 22 from the reproduced sound source 21. In this case, since the sound from the sound source 12 is propagated by 6 m and reaches the sound collecting unit 13, the sound reaches the sound collecting unit 13 at sound pressure multiplied by ⅙. The acoustic signal at the sound pressure multiplied by ⅙ is transmitted to the reproduced sound source 21 via the network or the like, further is propagated by 4 m and reaches the listener 22 from the reproduced sound source 21. Therefore, the sound from the sound source 11 reaches the listener 22 at the sound pressure multiplied by 1/24 (=⅙×¼).

In the acoustic communication system illustrated in FIG. 1, in a case where the sound source 11 and the sound source 12 individually generate sound with the same sound volume, the sound of the sound source 12 at the position of the listener 22 is perceived as sound smaller than the sound of the sound source 11 by approximately 15.6 dB (=⅙).

In the acoustic communication system illustrated in FIG. 1, the sound of the sound source 12 at the position of the listener 22 is perceived as sound smaller than the sound of the sound source 11 by approximately 15.6 dB. In a situation illustrated in FIG. 2, the sound of the sound source 12 at the position of the listener 22 is perceived as sound smaller than the sound of the sound source 11 by approximately 6 dB.

As mentioned above, in the acoustic communication system, in a case of environment as illustrated in FIG. 1, the listener 22 perceives the sound of the sound source 12 at the distant position from the sound collecting unit 13, as extremely small sound, as compared with the sound of the sound source 11 at the closer position from the sound collecting unit 13.

In other words, in the situation as illustrated in FIG. 2, a relationship of the sound pressure at which the listener 22 individually perceives the sound from the sound source 11 and the sound from the sound source 12 cannot be reproduced in the acoustic communication system illustrated in FIG. 1. The sound from the sound source 12 is perceived as extremely smaller sound than the sound from the sound source 11.

In the acoustic communication system, as the one factor that damages the realistic sense, it is not possible to keep the difference of the sound volume (difference of the sound pressure) between the sound sources.

This will be described again by using distances $r_{1\,a}$, $r_{1\,b}$, $r_2$, $r_a$, and $r_b$ illustrated in FIGS. 1 and 2.

In the acoustic system illustrated in FIG. 1, with the propagation, the sound of the sound source 11 is multiplied by $1/r_{1\,a}$ and reaches the sound collecting unit 13 on the sending side. The sound is released from the reproduced sound source 21 on the receiving side to reach the listener 22 at sound pressure multiplied by $1/r_2$ with propagation again. Therefore, the sound pressure of the sound from the sound source 11 has scale of $1/(r_{1\,a} \cdot r_2)$.

Similarly, the sound pressure of the sound from the sound source 12 has scale of $1/(r_{1\,b} \cdot r_2)$. Therefore, the difference of the sound volume between the sound source 11 and the sound source 12 perceived by the listener 22 is multiplied by $(r_{1\,a}/r_{1\,b})$. As mentioned above, in a case of $r_{1\,a}=1$ and $r_{1\,b}=6$, $\frac{1}{6}=-15.4$ dB is obtained.

On the other hand, as illustrated in FIG. 2, in a case of assuming a situation in which the sending side and the receiving side are not connected with the acoustic communication but are physically connected to each other, the sound source 11 and the listener 22 exist at a position apart from each other at a distance $r_a = r_{1\,a} + r_2$, and the sound source 12 and the listener 22 exist at a position apart from each other at a distance $r_b = r_{1\,b} + r_2$. In such a case, the sound of the sound source 11 reaches the listener 22 with scale of $1/r_a = 1/(r_{1\,b} + r_2)$ multiplied, and the sound of the sound source 12 reaches the listener 22 with scale of $1/r_b = 1/(r_{1\,b} + r_2)$ multiplied.

Therefore, the difference of the sound volume between the sound source 11 and the sound source 12 sensed by the listener 22 is $r_a/r_b = (r_{1\,a} + r_2)/(r_{1\,b} + r_2)$ multiplied. As mentioned above, in a case of $r_a=5$ and $r_b=10$, $5/10=-6.0$ dB is obtained.

When sound collection and sound reproduction for the acoustic communication are performed as mentioned above, such a phenomenon is caused that sound near the sound collecting unit 13 is emphasized and, on the other hand, far sound is suppressed. Therefore, the sound of the sound source (the sound source 12 in FIG. 1) at the position apart from the sound collecting unit 13 is more apart as compared with the actual position, the sense of perspective is confused, in addition, voice of a person at a position apart from the sound collecting unit 13 cannot be caught, various background sound forming the atmosphere such as sound of washing or an air conditioner cannot be caught, that is, harmful influence can be affected to the realistic sense.

Also, even in a case where the number of sound sources existing on the sending side is 1, such a phenomenon is similarly a problem, in a case where the sound source shifts, or the listener 22 shifts in person. For example, such a case is assumed that the sound source at the position of the sound source 11 shifts to the position of the sound source 12 at a certain time point. Under such a situation, in a case of using the acoustic communication, since the reduction in perceived sound volume due to an apart situation of the sound source is extremely large, it is sensed that the sound source might shift to a place farther than the realistic shift and a harmful influence can be affected to the realistic sense.

Accordingly, in order to avoid the harmful influence to the realistic sense, there is a wave field synthesis technology for physically reproducing the propagation on a wave field. However, in order to perform the wave field synthesis, a large number of microphones (sound collecting devices) and speakers (sound releasing devices) are required, and a transmitting band for communication is increased correspondingly thereto. Also, in order to perform interactive communication, echo cancel of a multi-channel is required, and therefore there is such a tendency that the technical hurdle is high and costs are increased.

Also, only if both sound far from the sound collecting unit and sound close thereto can be simply similarly heard, it is manageable to some extent by keeping the sound pressure output under gain control within a constant level range. However, only with this method, it is not operable in a case where a plurality of the sound sources simultaneously generates sound. In addition, sense of perspective to sound is completely lost in a case of excessive gain, on the contrary, the realistic sense can be lost.

It is required to efficiently cope with the above with a more simple method. By applying the present technology, which will be described below, it is possible to efficiently cope with the above with a more simple method.

<Configuration of Acoustic Communication System>

Figure 3:
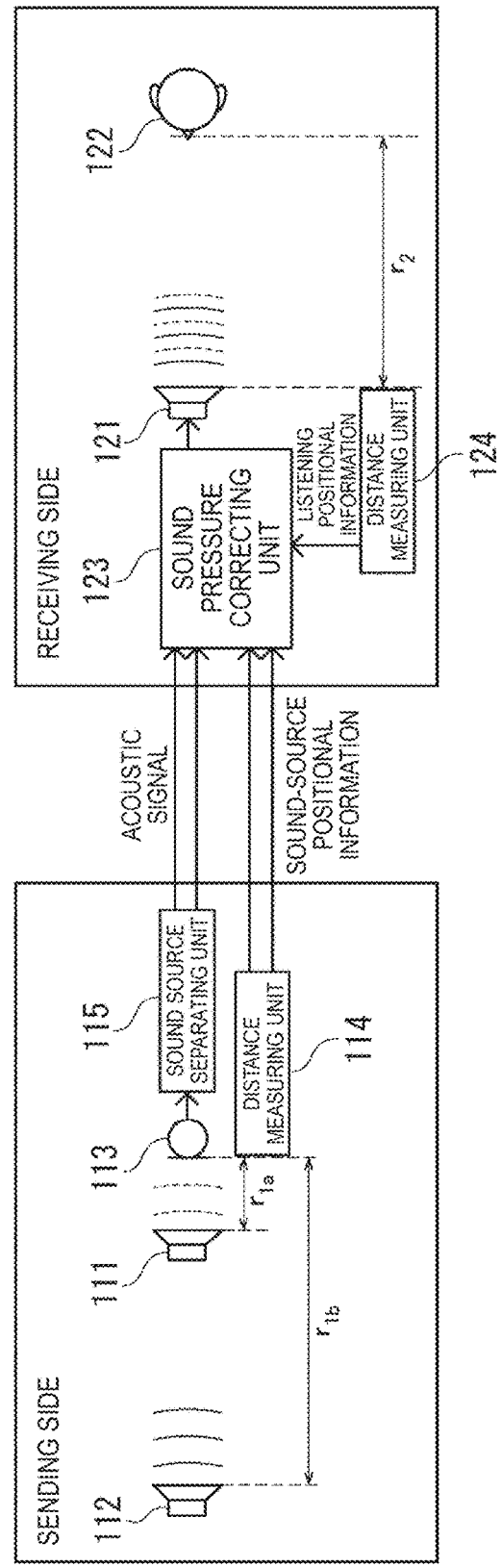
FIG. 3 is an illustration showing a configuration of an embodiment of an acoustic system to which the present technology is applied.

FIG. 3 is an illustration showing a configuration of an embodiment of the acoustic communication system to which the present technology is applied.

The acoustic communication system includes a sending side and a receiving side. The sending side includes a sound source 111, a sound source 112, a sound collecting unit 113, a sound source separating unit 115, and a distance measuring unit 114. The sound source 111 and the sound source 112 are persons, speakers, or the like, and generate sound. The sound collecting unit 113 is a microphone or the like, and collects sound from the sound source 111 and the sound source 112. The sound collected by the sound collecting unit 113 is supplied to the sound source separating unit 115.

As illustrated in FIG. 3, in a case where there are, for example, two sound source 111 and sound source 112, the sound source separating unit 115 separates sound from the sound source 111 and sound from the sound source 112. The separated sound (acoustic signal) is supplied to the receiving side connected via a network or the like.

The distance measuring unit 114 measures a distance between the sound source and the sound collecting unit 13. For example, as illustrated in FIG. 3, in a case where there are two sound sources 111 and 112, the distance measuring unit 114 individually measures a distance between the sound source 111 and the sound collecting unit 113 and a distance between the sound source 112 and the sound collecting unit 113. Note that, in the following description, it is assumed that the distance between the sound source 111 and the sound collecting unit 113 is a distance $r_{1\,a}$ and the distance between the sound source 112 and the sound collecting unit 113 is a distance $r_{1\,b}$.

The distance (sound-source positional information) measured by the distance measuring unit 114 is supplied to the receiving side together with the acoustic signal from the sound source separating unit 115. Herein, although the distance measuring unit 114 and the sound source separating unit 115 are individual units, as will be described later, the distance measuring unit 114 and the sound source separating unit 115 may have a configuration of a single signal processing device, alternatively, as a single signal processing device including the sound collecting unit 113.

The receiving side includes a reproduced sound source 121, a sound pressure correcting unit 123, and a distance measuring unit 124. The reproduced sound source 121 is a speaker or the like, that is, a sound releasing device that reproduces the sound sent from the sending side. A listener 122 listens to sound from the reproduced sound source 121.

The sound pressure correcting unit 123 functions as a signal processing device that processes the acoustic signal from the sending side. Sound-source positional information from the distance measuring unit 114 on the sending side and the acoustic signal from the sound source separating unit 115 are supplied to the sound pressure correcting unit 123. Also, listening positional information from the distance measuring unit 124 is supplied to the sound pressure correcting unit 123. The distance measuring unit 124 measures a distance between the reproduced sound source 121 and the listener 122. Herein, it is assumed that the distance between the reproduced sound source 121 and the listener 122 is a distance $r_2$.

The sound pressure correcting unit 123 calculates, from the sound-source positional information and the listening positional information, a distance between the sound source on the sending side and the listener 122 who exists in the same space, for example, a distance between the sound source and the listener 122 under the situation as illustrated in FIG. 2, and corrects the supplied acoustic signal so that the sound from the sound source is supplied to the listener 122 at sound pressure that can be heard under such a situation. Specifically, a value corresponding to the distance is multiplied to the acoustic signal, thereby correcting the gain.

Also in FIG. 3, similarly to the acoustic communication system illustrated in FIG. 1, it is assumed that the sound collecting unit 113 and the sound source 111 on the sending side are apart from each other by 1 m (=$r_{1\,a}$). Further, it is assumed that the sound collecting unit 113 and the sound source 112 on the sending side are apart from each other by 6 m (=$r_{1\,b}$). Furthermore, it is assumed that the reproduced sound source 121 and the listener 122 on the receiving side are apart from each other by 4 m (=$r_2$).

In order to avoid the factor that damages the above-mentioned realistic sense, the device on the sending side needs to estimate the position of the sound source and simultaneously measure the position of the listener on the receiving side. Accordingly, in the acoustic communication system illustrated in FIG. 3, the receiving side has the distance measuring unit 124 that measures a distance from the reproduced sound source 121 to the listener 122, and the sound pressure correcting unit 123 corrects the sound pressure also in consideration of the measured distance.

In a case where a distance between the sound source 111 or the sound source 112 and the sound collecting unit 113 on the sending side is a distance r1 and a distance between the reproduced sound source 121 on the receiving side and the listener 122 is a distance r2, the sound pressure correcting unit 123 can restore a difference of the sound volume between the respective sound sources by multiplying the acoustic signal corresponding to the sound source (the sound source 111 or the sound source 112) by $(r_1 \cdot r_2)/(r_1+r_2)$. Note that $r_1$ is a distance $r_{1\,a}$ or a distance $r_{1\,b}$ in FIG. 3.

In a case of $r_{1\,a}$=1 m, $r_{1\,b}$=6 m, and $r_2$=4 m, the sound pressure correcting unit 123 adjusts the sound volume of the acoustic signal from the sound source 111 by the following:

$$(r_{1\,a} \cdot r_2)/(r_{1\,a}+r_2) = 1 \cdot 4/(1+4) = -1.94 \text{ dB}$$

and also adjusts the sound volume of the acoustic signal from the sound source 112 by the following:

$$(r_{1\,b} \cdot r_2)/(r_{1\,b}+r_2) = 6 \cdot 4/(6+4) = 7.60 \text{ dB}.$$

By adjusting the sound volume (correcting the gain) as mentioned above, as compared with the sound from the sound source 111, the sound from the sound source 112 is amplified by 9.54 (=7.60−(−1.94)) dB, is reproduced from the reproduced sound source 121, and is released.

In the description with reference to FIGS. 1 and 2, the difference of the sound pressure between the sound source 11 and the sound of the sound source 12 is 15.6 dB in the acoustic signal system illustrated in FIG. 1 and is 6 dB under the situation illustrated in FIG. 2 as mentioned above. In this case, a difference of the sound pressure is 9.4 (=15.4−6.0) dB between the sound pressure in the acoustic signal system illustrated in FIG. 1 and the sound pressure in the case of hearing in the same space illustrated in FIG. 2.

If the difference (difference A) is solved, the difference of the sound pressure in the case of hearing in the same space illustrated in FIG. 2 can also be restored in the acoustic signal system illustrated in FIG. 1. By performing the above-mentioned processing (correcting the gain), in the above-mentioned example, as compared with the sound from the sound source 111, the sound from the sound source 112 is amplified by 9.54 (=7.60−(−1.94)) dB. Thus, the difference A can be solved.

Therefore, the sound pressure correcting unit 123 corrects the sound pressure as mentioned above, thereby solving mismatch of the relationship of the difference of the sound volume between the above-mentioned sound sources or mismatch of the relationship of the difference of the sound volume between the shifting sound sources or before/after the shift of the listener. Thus, it is possible to provide acoustic sound with improvement of the realistic sense.

Figure 4:
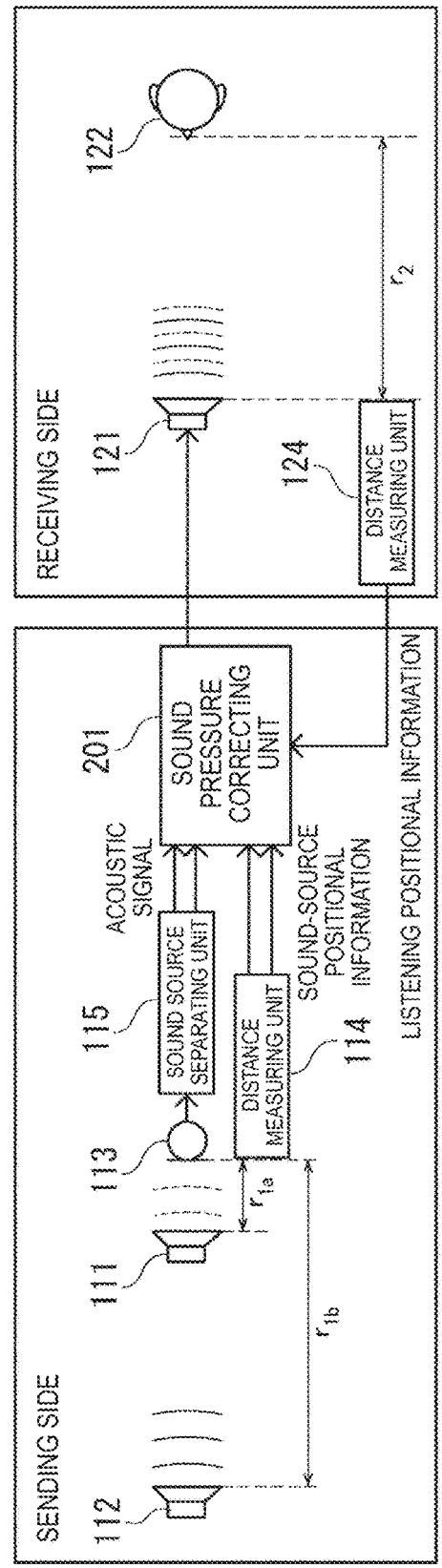
FIG. 4 is an illustration showing a configuration of another embodiment of the acoustic system to which the present technology is applied.

FIG. 4 is an illustration showing a configuration of another embodiment of the acoustic communication system to which the present technology is applied.

In the acoustic communication system illustrated in FIG. 4, regarding the same parts as those in the acoustic communication system illustrated in FIG. 3, the same reference numerals are given and a description is appropriately omitted. In the acoustic communication system illustrated in FIG. 4, the correction of the sound pressure performed on the receiving side is performed on the sending side.

That is, as compared with the sending side of the acoustic communication system illustrated in FIG. 3, the sending side of the acoustic communication system illustrated in FIG. 4 has a configuration obtained by adding a sound pressure correcting unit 201, and other parts are identical. Also, in a case of comparing the receiving side of the acoustic communication system illustrated in FIG. 4 with the receiving side of the acoustic communication system illustrated in FIG. 3, differently, the receiving side of the acoustic communication system illustrated in FIG. 4 has a configuration obtained by deleting the sound pressure correcting unit 123 (FIG. 3), and other parts are identical.

The sound pressure correcting unit 201 provided on the sending side receives the supply of the individual acoustic signals from the sound source 111 and the sound source 112, which are separated by the sound source separating unit 115, and the individual sound-source positional information of the sound source 111 and the sound source 112 from the distance measuring unit 114. Also, the sound pressure correcting unit 201 receives listening positional information relating to a distance between the reproduced sound source 121 and the listener 122 from the distance measuring unit 124 provided on the receiving side via the network.

The sound pressure correcting unit 201 performs the processing similar to the above-mentioned sound pressure correcting unit 123, consequently corrects the acoustic signals from the sound source 111 and the sound source 112 at the sound pressure in consideration of the distances between the listener 122 and the sound source 111 or the sound source 112, and supplies, to the receiving side, an acoustic signal in a state of solving the mismatch of the relationship of the difference of the sound volume between the sound sources and the mismatch of the relationship of the difference of the sound volume between the shifting sound sources or before/after the shift of the listener.

On the receiving side, in order to receive the acoustic signal that is obtained by already correcting the sound pressure, the reproduced sound source 121 only reproduces the supplied acoustic signal, thereby enabling the supply of the sound to the listener 22 in the state of solving the mismatch of the relationship of the difference of the sound volume between the sound sources and the mismatch of the relationship of the difference of the sound volume between the shifting sound sources or before/after the shift of the listener, as mentioned above.

As mentioned above, as in the acoustic communication system illustrated in FIG. 4, it is also configured to complete the correction of the sound pressure on the sending side. In a case of such a configuration, in a case where the listening positional information is not obtained from the receiving side, it is determined that a predetermined listening position is determined and the sound pressure is corrected. As a consequence thereof, even if the device on the receiving side does not assume the correction of the difference of the existing sound pressure, advantageously, it is connectable.

<Configurations of Sound Source Separating Unit and Distance Measuring Unit>

A description will be given of configurations of the sound collecting unit 113, the distance measuring unit 114, and the sound source separating unit 115 in the acoustic communication system illustrated in FIG. 3 or FIG. 4.

Figure 5:
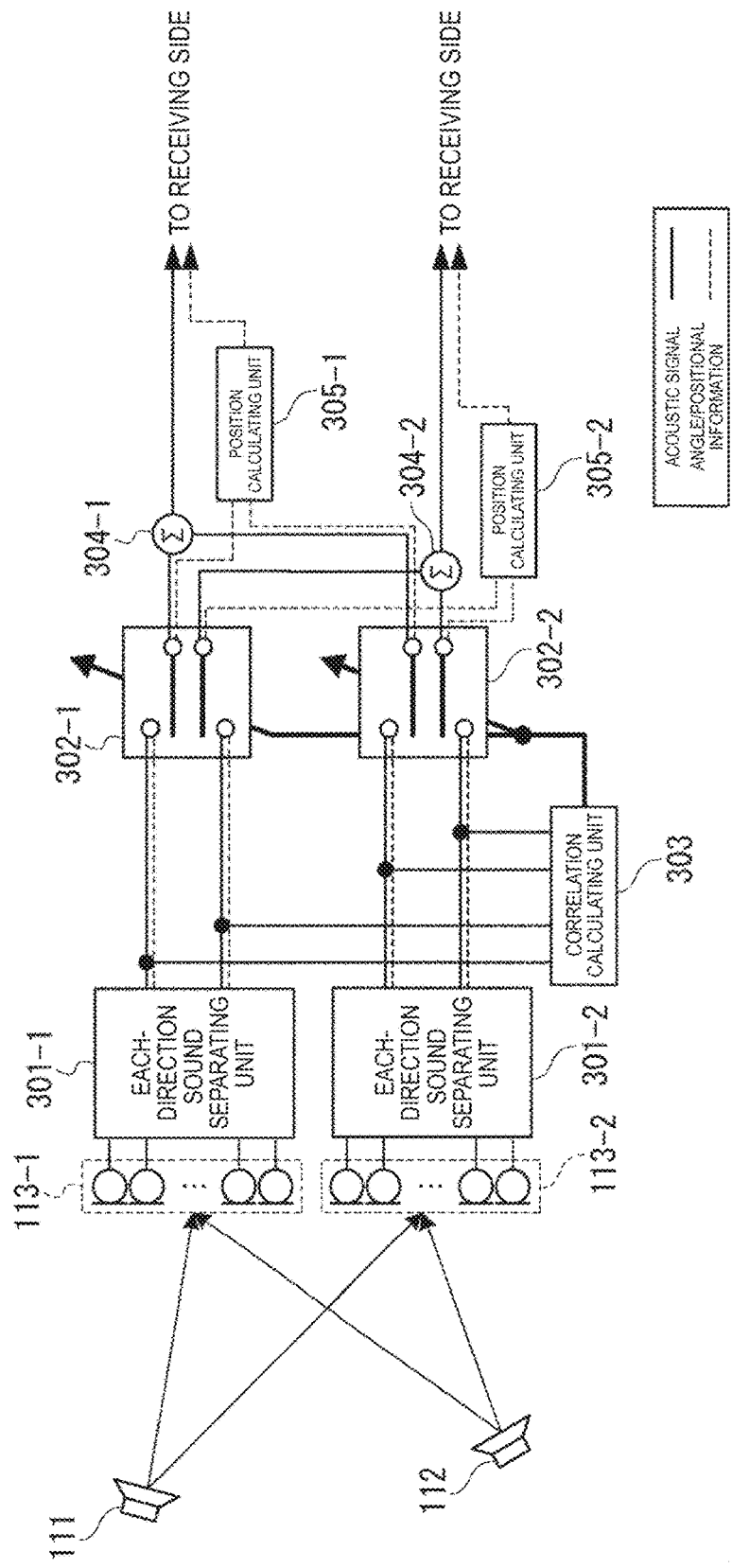
FIG. 5 is an illustration showing configurations of a sound source separating unit and a distance measuring unit.

FIG. 5 is an illustration showing the configurations of the sound collecting unit 113, the distance measuring unit 114, and the sound source separating unit 115. In the configurations illustrated in FIG. 5, the distance measurement and the separation of the sound sources are simultaneously performed. FIG. 5 illustrates the configurations in a case where a single signal processing device includes the sound collecting unit 113, the distance measuring unit 114, and the sound source separating unit 115.

In the signal processing device illustrated in FIG. 5, the sound collecting unit 113 includes a sound collecting unit 113-1 and a sound collecting unit 113-2. The sound collecting unit 113-1 and the sound collecting unit 113-2 are provided in a state of having a predetermined distance.

Also, the sound collecting unit 113-1 and the sound collecting unit 113-2 individually have microphone arrays obtained by providing a plurality of microphones, for example, in the traverse direction. In the following description, in a case where the sound collecting unit 113-1 and the sound collecting unit 113-2 do not need to be individually separated, the sound collecting units 113-1 and 113-2 are simply referred to as the sound collecting unit 113. Further, other parts are similarly described.

The sound collected by the sound collecting unit 113-1 is supplied to an each-direction sound separating unit 301-1, and the sound collected by the sound collecting unit 113-2 is supplied to an each-direction sound separating unit 301-2. An each-direction sound separating unit 301 separates the supplied sound into each direction.

The sound collecting unit 113 includes a microphone array, and the microphone array is divided into a plurality of parts for processing. Regarding the individual partial arrays of the microphone array divided into the plurality of parts, the each-direction sound separating unit 301 estimates the direction of the sound source on the basis of, for example, a Multiple signal classification (MUSIC) method, and separates the sound into each estimated direction.

Regarding the MUSIC method, a method described in the following literature can be applied.

R. O. Schmidt, "Multiple emitter location and signal parameter estimation," IEEE Trans. Antennas Propagation, vol. AP-34, no. 3, pp. 276-280, March 1986.

The acoustic signal separated into each direction by the each-direction sound separating unit 301-1 is supplied to a switch 302-1 and a correlation calculating unit 303. Also, the acoustic signal separated into each direction by the each-direction sound separating unit 301-2 is supplied to a switch 302-2 and the correlation calculating unit 303.

With the processing by the each-direction sound separating unit 301, information relating to the direction of the sound source can also be obtained. Information (directional information) relating to the direction estimated by the each-direction sound separating unit 301-1 is also supplied to the switch 302-1. Further, information relating to the direction estimated by the each-direction sound separating unit 301-2 is also supplied to the switch 302-2.

The correlation calculating unit 303 calculates mutual correlation of individual combinations of the separated acoustic signals, and determines that the acoustic signal in a direction with high correlation includes sound of the same sound source. The switch 302-1 and the switch 302-2 respectively change-over switching in response to an instruction of the correlation calculating unit 303. That is, the switch 302-1 and the switch 302-2 individually perform the switching to supply the acoustic signal determined with high correlation to an adding unit 304-1 or an adding unit 304-2.

The acoustic signal determined as having high correlation is supplied to an adding unit 304. For example, as illustrated in FIG. 5, in a case where the sound from the sound source 111 and the sound source 112 is individually collected by the sound collecting unit 113, the acoustic signal from the sound source 111 collected by the sound collecting unit 113-1 and the acoustic signal from the sound source 111 collected by the sound collecting unit 113-2 are supplied to the adding unit 304-1. The adding unit 304-1 adds and averages the supplied acoustic signals, and supplies the signals to the receiving side via the network.

Similarly, the acoustic signal from the sound source 112 collected by the sound collecting unit 113-1 and the acoustic signal from the sound source 112 collected by the sound collecting unit 113-2 are supplied to the adding unit 304-2. The adding unit 304-2 adds and averages the supplied acoustic signals, and supplies the signals to the receiving side via the network.

Note that the description has been given of the addition and averaging here. However, with another calculation, two or more acoustic signals may be synthesized. Also, here, the adding unit 304 is provided, the addition and averaging are performed, and the signals are supplied to the receiving side. However, without providing the adding unit 304, a switch 302 may select the acoustic signal at higher level, and the signal may be supplied to the receiving side.

Directional information is also supplied to the switch 302 from the each-direction sound separating unit 301. The directional information selected by the switch 302 is supplied to a position calculating unit 305. For example, in a case where the switch 302-1 selects the directional information of the sound source 111 and supplies the information to a position calculating unit 305-1, the switch 302-2 also selects the directional information of the sound source 111, and supplies the information to the position calculating unit 305-1. Also, at this time, the switch 302-2 selects directional information of the sound source 112, and supplies the information to a position calculating unit 305-2. The switch 302-2 selects the directional information of the sound source 112, and supplies the information to the position calculating unit 305-2.

In the case, the acoustic signal of the sound source 111 whose sound is collected by an array unit (set as a first array unit) at a predetermined part of the sound collecting unit 113-1 is supplied to the adding unit 304-1, and directional information relating to the direction of the sound source 111 to the first array unit is supplied to the position calculating unit 305-1. Also, similarly, the acoustic signal of the sound source 111 whose sound is collected by an array unit (set as a second array unit) at a predetermined part of the sound collecting unit 113-2 is supplied to the adding unit 304-1, and the directional information relating to the direction of the sound source 111 to the second array unit is supplied to the position calculating unit 305-1.

The position calculating unit 305-1 has already obtained in advance the distance between the first array unit and the second array unit. By using the distance, the directional information relating to the direction of the sound source 111 to the first array unit, and the directional information relating to the direction of the sound source 111 to the second array unit, the distance to the sound source 111 is calculated with, for example, the principle of triangulation.

Positional information of the sound source 111 calculated by the position calculating unit 305-1 is related to the acoustic signal of the sound source 111 output from the adding unit 304-1, and is supplied to the receiving side.

Similarly, the acoustic signal of the sound source 112 whose sound is collected by an array unit (set as a third array unit) at a predetermined part of the sound collecting unit 113-1 is supplied to the adding unit 304-2, and directional information relating to the direction of the sound source 112 to the third array unit is supplied to the position calculating unit 305-2. Also, similarly, the acoustic signal of the sound source 112 whose sound is collected by an array unit (set as a fourth array unit) at a predetermined part of the sound collecting unit 113-2 is supplied to the adding unit 304-2, and the directional information relating to the direction of the sound source 112 to the second array unit is supplied to the position calculating unit 305-2.

The position calculating unit 305-2 has already obtained in advance a distance between the third array unit and the fourth array unit. By using the distance, the directional information relating to the direction of the sound source 112 to the third array unit, and the directional information relating to the direction of the sound source 112 to the fourth array unit, a distance to the sound source 112 is calculated with, for example, the principle of triangulation.

Positional information of the sound source 112 calculated by the position calculating unit 305-2 is related to the acoustic signal of the sound source 112 output from the adding unit 304-2 and is supplied to the receiving side.

As mentioned above, the acoustic signal from the sound source 111 and the distance between the sound source 111 and the sound collecting unit 113 are individually obtained and related to each other, and are supplied to the receiving side. Also, the acoustic signal from the sound source 112 and the distance between the sound source 112 and the sound collecting unit 113 are individually obtained and related to each other, and are supplied to the receiving side.

Note that the example of the processing to the two sound sources has been mentioned here. However, by similarly processing two or more sound sources, the acoustic signals and the distances from the individual sound sources are calculated and related to each other, and are supplied to the receiving side.

Herein, the configurations illustrated in FIG. 5 are exemplified, and the description has been given of the configurations and operations of the sound collecting unit 113, the distance measuring unit 114, and the sound source separating unit 115 in a case of obtaining the distance and the acoustic signal. However, the distance and the acoustic signal may be obtained with another configuration and another method.

For example, in a case where the number of speakers or sound generators (the number of the sound sources) are known in advance on the sending side, corresponding to the number, the array units of the sound collecting unit 113 may be divided and processed.

Also, in a case where microphones called pin microphones or the like are attached to the individual sound sources and can collect sound in proximity to the sound sources, the sound collecting unit 113 in proximity to the individual sound sources can obtain the acoustic signals from the individual sound sources. Therefore, processing for separating the sound collected by the sound collecting unit 113 into each sound source can be omitted. In the case, the sound collecting unit 113 does not include the microphone array, but includes a plurality of microphones such as pin microphones.

Also, in a case of determining the setting position of, e.g., the sound collecting unit 113 in advance, the setting position of the sound source may be obtained. For example, the positional information input in advance by a user may be used.

Also, in the example illustrated in FIG. 5, the example of calculating the distance to the sound source by using the MUSIC method or the triangulation is shown. However, the distance may be calculated by using another method, e.g., image analysis, an electrical-wave position measuring unit, or the like.

For example, an imaging device to capture images of the sound source 111 and the sound source 112 may be set at a near position of the sound collecting unit 113, and the image captured by the imaging device may be analyzed, thereby the distance to the sound source 111 or the sound source 112 may be estimated.

Further, the position of the sound source may be specified by an electrical-wave position measuring unit such as a global positioning system (GPS), and a distance from the sound collecting unit 113 to the sound source may be estimated. Further, a distance to a target matter (sound source) may be measured by using electric waves such as infrared.

Meanwhile, in a case of using a device that is set at a position in proximity to the sound source such as the above-mentioned pin microphone and collects the sound from the sound source (in a case of collecting the sound in proximity), a positional relationship between the sound collecting unit and the sound source is also approximately the same as that between any sound collecting unit and the sound source.

As described with reference to FIG. 3 (or FIG. 5), in a case where the distance between the sound collecting unit 113 and the sound source 111 is different from the distance between the sound collecting unit 113 and the sound source 112, the sound pressure correcting unit 123 (or the sound pressure correcting unit 201) corrects the sound pressure by using the distance. However, in the case of collecting the sound in proximity, as mentioned above, the same distance can be obtained.

Accordingly, in the case of collecting the sound in proximity, a predetermined position may be assumed as a sound collecting position, distances to the individual sound sources from the assumed sound collecting position may be calculated, and the sound pressure of the sound from the individual sound sources may be controlled. For example, in a case of a system called a TV telephone or the like for communication while capturing a video image with a camera or the like, at time of the sound collection in proximity, the distances to the individual sound sources from the camera may be calculated, and the sound pressure of the sound from the individual sound sources may be controlled.

Also, in the case of collecting the sound in proximity, before sending the acoustic signal to the receiving side, an amount of attenuation is multiplied, that is, the amount of attenuation might be received in a case of propagating the sound to a reference position (e.g., the position of a camera or the like in a case of adding a video image) on the sending side on the basis of the obtained positional information. As mentioned above, on the receiving side, the same processing is performed without distinguishing between the case of using the above-mentioned microphone array and the case of collecting the sound in proximity, thereby enabling a relationship of the difference of the sound pressure between the sound sources to be corrected and restored.

Also, the processing can be performed on the receiving side without distinguishing between the case of using the above-mentioned microphone array and the case of collecting the sound in proximity, thereby enabling matching the case of using the microphone array to the case of collecting the sound in proximity.

That is, gain to offset the amount of attenuation received during the propagation from the sound source to the central position of the microphone array is multiplied to the acoustic signal after separating the sound by using the microphone array and collecting the sound, and the resultant signal is sent, thereby enabling the correction and restoration of the relationship of the difference of the sound pressure between the sound sources on the receiving side without distinguishing the sound in the case of collecting the sound in proximity from the case of sending the sound without change.

As mentioned above, on the sending side, in other words, the sound is collected on a side for collecting the sound, and the distance to the sound source is measured. Next, a description will be given of a configuration and operations of the sound pressure correcting unit for obtaining and processing the acoustic signal and the distance.

<Configuration and Operation of Sound Pressure Correcting Unit>

Figure 6:
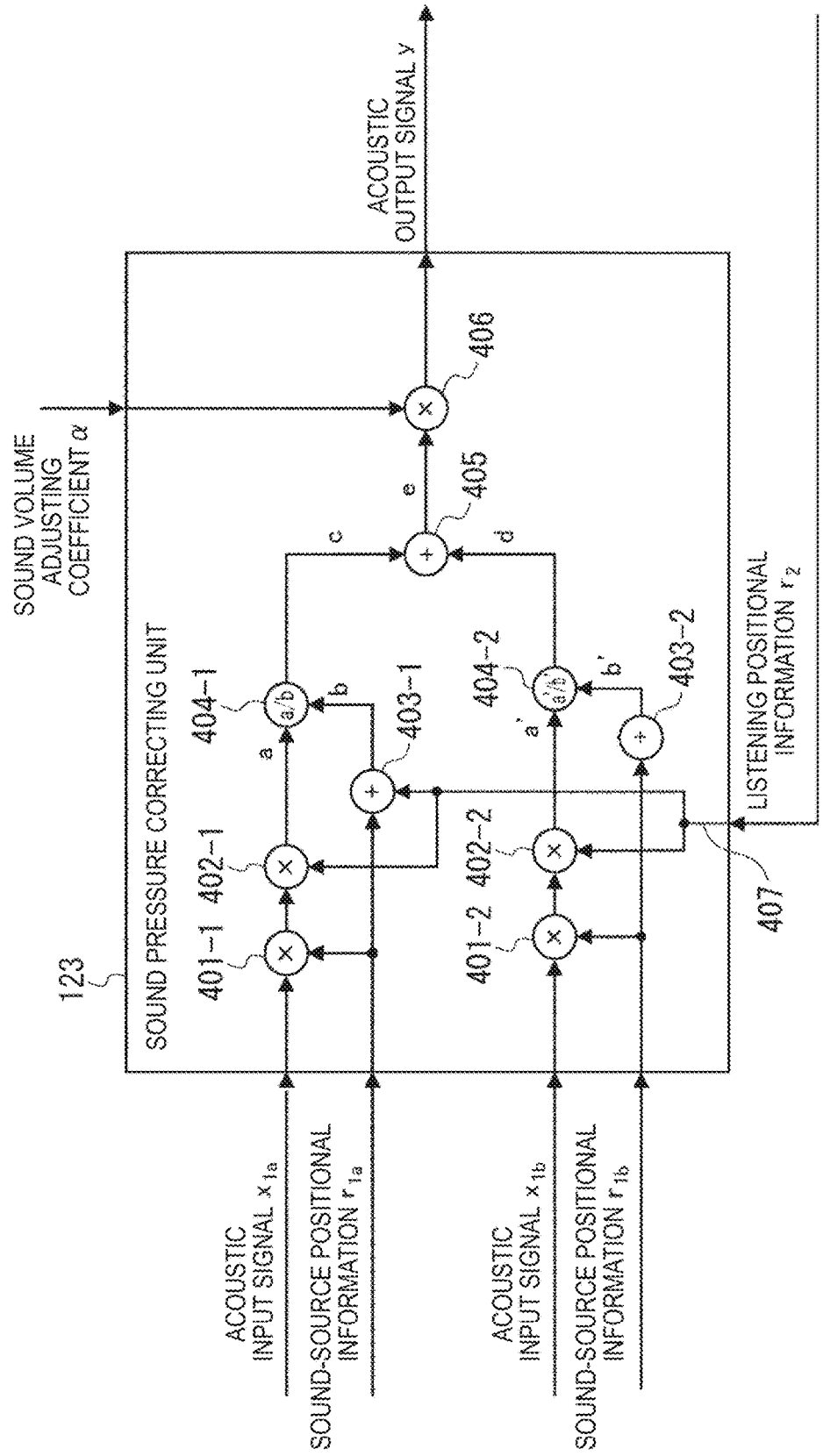
FIG. 6 is an illustration showing a configuration of a sound pressure correcting unit.

FIG. 6 is an illustration showing a configuration of the sound pressure correcting unit 123 (FIG. 3). Here, the sound pressure correcting unit 201 illustrated in FIG. 4 basically has a configuration similar to that of the sound pressure correcting unit 123 illustrated in FIG. 6. Therefore, a description will be given of the sound pressure correcting unit 123 as an example here.

The sound pressure correcting unit 123 includes a multiplier 401-1, a multiplier 402-1, an adding unit 403-1, a dividing unit 404-1, a multiplier 401-2, a multiplier 402-2, an adding unit 403-2, a dividing unit 404-2, an adding unit 405, and a multiplying unit 406, and also includes an input unit 407 that inputs the listening positional information from the distance measuring unit 124.

The acoustic signals supplied from the sending side are referred to as an acoustic input signal $x_{1\,a}$ and an acoustic input signal $x_{1\,b}$. Also, of the sound-source positional information supplied from the sending side, the sound-source positional information relating to the acoustic input signal $x_{1\,a}$ is referred to as sound-source positional information $r_{1\,a}$, and the sound-source positional information relating to the acoustic input signal $x_{1\,b}$ is referred to as sound-source positional information $r_{1\,b}$. Further, the positional information of the listener 122 is referred to as listening positional information $r_2$.

The acoustic input signal $x_{1\,a}$ and the sound-source positional information $r_{1\,a}$ are supplied to the multiplier 401-1. The multiplier 401-1 multiplies the supplied acoustic input signal $x_{1\,a}$ and the sound-source positional information $r_{1\,a}$, and supplies the resultant signal to the multiplying unit 402-1. The listening positional information $r_2$ is also supplied to the multiplying unit 402-1. The multiplying unit 402-1 multiplies (acoustic input signal $x_{1\,a}$×sound-source positional information $r_{1\,a}$) from the multiplier 401-1 to the listening positional information $r_2$.

In the so-far processing, (acoustic input signal $x_{1\,a}$×sound-source positional information $r_{1\,a}$)×listening positional information $r_2$=$(x_{1\,a} \times r_{1\,a} \times r_2)$=$a$ is calculated. The value is expressed as "a" in FIG. 6.

The sound-source positional information $r_{1\,a}$ and the listening positional information $r_2$ are supplied to the adding unit 403-1. The adding unit 403-1 adds the supplied sound-source positional information $r_{1\,a}$ and listening positional information $r_2$.

(sound-source positional information $r_{1\,a}$+listening positional information $r_2$)=$(r_{1\,a}+r_2)$=$b$ The value a from the multiplying unit 402-1 and a value b from the adding unit 403-1 are supplied to the dividing unit 404-1. The dividing unit 404-1 divides the value a by the value b.

$$a/b =$$

$$((\text{acoustic input signal } x_{1a} \times \text{sound-source positional information } r_{1a}) \times$$

$$\text{listening positional information } r_2)/$$

$$(\text{sound-source positional information } r_{1a} +$$

$$\text{listening positional information } r_2) =$$

$$(x_{1a} \times r_{1a} \times r_2)/(r_{1a} + r_2) = x_{1a} \times ((r_{1a} \times r_2)/(r_{1a} + r_2))$$

The value is set as a value c. The value c is, e.g., the acoustic signal from the sound source 111 after correcting the sound pressure.

As a result of the so-far calculation, a value (acoustic signal) obtained by multiplying the acoustic input signal $x_{1\,a}$ by $((r_{1\,a} \cdot r_2)/(r_{1\,a}+r_2))$ is calculated.

Also in the multiplier 401-2, the multiplier 402-2, the adding unit 403-2, and the dividing unit 404-2, the similar processing is performed to the acoustic input signal $x1b$, the sound-source positional information $r1b$, and the listening positional information $r2$, thereby calculating a value (acoustic signal) obtained by multiplying the acoustic input signal $x_{1\,b}$ by $((r_{1\,b} \cdot r_2)/(r_{1\,b}+r_2))$.

$$a'/b' = x_{1\,b} \times ((r_{1\,b} \cdot r_2)/(r_{1\,b}+r_2))$$

The value is set as a value d. For example, the value d is the acoustic signal from the sound source 112 after correcting the sound pressure.

The value c is supplied to the adding unit 405 from the dividing unit 404-1, and the value d is supplied from the dividing unit 404-2. The adding unit 405 adds (synthesizes) the supplied value c and value d. That is, in the adding unit 405, the acoustic signals after correcting the sound pressure from different sound sources are synthesized to one acoustic signal. An output from the adding unit 405 is set as a value e.

The value e from the adding unit 405 is supplied to the multiplying unit 406. A sound volume adjusting coefficient α is also supplied to the multiplying unit 406. The sound volume adjusting coefficient α can be, e.g., sound volume instructed by the listener 122. The multiplying unit 406 multiplies the value e by the sound volume adjusting coefficient α, and outputs an acoustic output signal y to the reproduced sound source 121 (FIG. 3).

The acoustic output signal y is an acoustic signal after correcting the sound pressure, and is an acoustic signal obtained by solving the mismatch of the relationship of the difference of the sound volume between the sound sources and the mismatch of the relationship of the difference of the sound volume between the shifting sound sources or before/after the shift of the listener.

According to the above-mentioned embodiment, the case has been described as the example in which on the receiving side, the listener 122 listens to sound alone at a position apart from the reproduced sound source 121 such as a speaker by a distance r2. According to the example, on the receiving side, a case of using the speaker or a case of using a headphone or an earphone as the sound reproducing device is considered. Also, the listener 122 can be one or a plurality of persons.

As described with reference to FIGS. 3 and 4, in a case of using a single speaker, one listener can listen to the sound obtained by correctly restoring the relationship of the difference of the sound volume in the above-mentioned processing. However, in an actual using case, the number of the listeners is not limited to one, and a plurality of listeners should be also assumed.

Accordingly, the distance $r_2$ between the reproduced sound source 121 and the listener 122 is set as follows. Herein, as a setting reference of the listening distance $r_2$, the following three references are exemplified. References 1 and 2 will be described with reference to FIG. 7.

Reference 1: an average position of the listener is used (average distance).

Reference 2: a position of the listener existing at the closest distance is used (the closest distance).

Reference 3: the position of the listener is not estimated and a preset fixed distance is used (fixed value).

Figure 7:
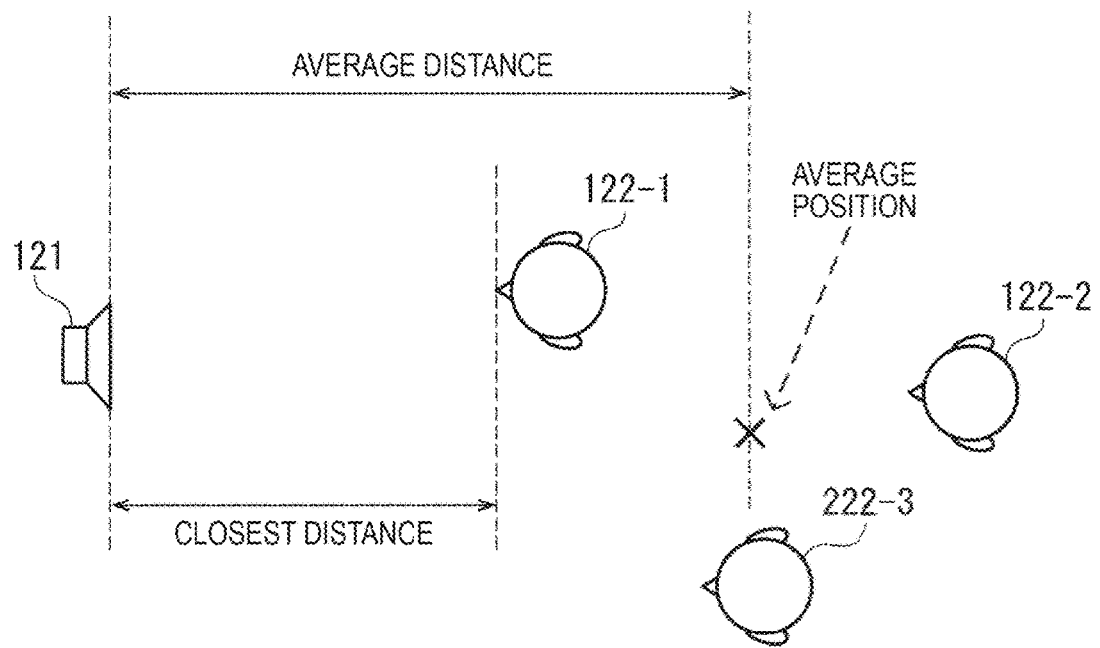
FIG. 7 is an illustration for explaining setting of a listening distance.

A case will be considered of listening to the sound from the reproduced sound source 121 by three listeners 122-1 to 122-3 with reference to FIG. 7. In a case of setting the distance $r_2$ with Reference 1, a distance between the listener 122-1 and the reproduced sound source 121, a distance between the listener 122-2 and the reproduced sound source 121, and a distance between the listener 122-3 and the reproduced sound source 121 are individually measured (obtained), an average value thereof is calculated, and the average value is set as the distance $r_2$.

In a case of setting the distance $r_2$ with Reference 2, a distance between the listener 122 existing at the closest position from the reproduced sound source 121 and the reproduced sound source 121 is set as the distance $r_2$. In the case of FIG. 7, the distance between the listener 122-1 and the reproduced sound source 121 is set as the distance $r_2$.

In a case of setting the distance $r_2$ with Reference 3, the preset fixed value is set as the distance $r_2$ between the listener 122 and the reproduced sound source 121.

In the case of setting the distance $r_2$ with Reference 1, the sound pressure corresponding to the situation at listening time can be accurately corrected, as compared with other References. Therefore, it is possible for the individual listeners 122-1 to 122-3 to provide the acoustic signal obtained by solving the mismatch of the relationship of the difference of the sound volume between the sound sources or the mismatch of the relationship of the difference of the sound volume between the shifting sound sources or before/after the shift of the listener.

In the case of setting the distance $r_2$ with Reference 2, it is possible to set the distance more safely than other References. As mentioned above, the sound pressure correcting unit 123 corrects the sound pressure by multiplying the acoustic signal corresponding to the sound source by $(r_1 \cdot r_2)/(r_1+r_2)$. From the formula, it can be understood that, as the distance $r_2$ is larger, an amount of correction is larger.

In the situation illustrated in FIG. 7, if the distance between the listener 122-2 farthest from the reproduced sound source 121 and the reproduced sound source 121 is the distance $r_2$, the amount of correction in the sound pressure correcting unit 123 is large. In the case, the corrected acoustic signal can have loud sound. In other words, excessively large gain is applied.

In order to prevent the above, a distance between the listener existing at the closest position to the reproduced sound source 121 and the reproduced sound source 121 is set as the distance $r_2$. Then, in the case of setting the distance $r_2$ with Reference 2, it is possible to provide the acoustic signal obtained by solving the mismatch of the relationship of the difference of the sound volume between the sound sources and the mismatch of the relationship of the difference of the sound volume between the shifting sound sources or before/after the shift of the listener.

With Reference 3, the distance measuring unit 124 (FIGS. 3 and 4) may not measure the distance. Therefore, in the case of setting the distance r2 with Reference 3, also in a case where the receiving side does not have the distance measuring unit 124, it is possible to provide the acoustic signal obtained by solving the mismatch of the relationship of the difference of the sound volume between the sound sources and the mismatch of the relationship of the difference of the sound volume between the shifting sound sources or before/after the shift of the listener.

Further, Reference 3 can be applied to a case where the listening position is fixed to some degree, e.g., the listeners 122 are aligned and sit on a sofa. That is, in the case, if the position of the sofa is not changed, the change in distance between the listener 122 and the reproduced sound source 121 is small and the distance $r_2$ can have a fixed value, and the distance $r_2$ can be a distance between the sofa and the reproduced sound source 121.

Herein, References 1 to 3 have been described as examples, but in a case where another Reference is provided and a distance between the reproduced sound source 121 and the listener 122 is set, the present technology also can be applied.

As mentioned above, a single speaker (reproduced sound source 121) is used on the receiving side, advantageously, e.g., it is easy to realize an echo canceller required for interactive communication. In the interactive communication, if the number of microphones or speakers is small, it is relatively easy to enable the realization of an echo canceller to remove an echo to be sent again to a partner side of sound generated from the speaker, caught by the microphone on the same side.

However, in a case of the number of microphones or speakers in scale for use for, e.g., wave field synthesis, for the individual numbers of combinations thereof, the echo canceller needs to be prepared. Therefore, it is not easy to enable the realization thereof.

According to the above-mentioned present embodiment, even if the number of speakers is one, it is possible to keep the relationship of the difference of the sound pressure between the sound sources. Therefore, the number of echo cancellers is suppressed to at most the number of microphones. Further, the influence of echoes can be reduced by adjusting the directivity in a case of separating the each-directional sound and reducing the sensitivity of a speaker in a direction.

Note that, according to the above-mentioned embodiment, one-way communication (to the receiving side from the sending side) has been described as an example. However, the present technology also can be applied to the interactive communication.

<Regarding Acoustic Signal as Correcting Target>

According to the above-mentioned embodiment, the description has been given of the acoustic communication system called the TV telephone, TV conference, or the like, as an example. However, the present technology can be applied to a technology except for such a tele-presence technology.

There is a technology that the acoustic signal is recorded or distributed with a relation to positional information, like a sending side of the tele-presence. Also in a case of obtaining the information with the relation between the recorded or distributed acoustic signal and the positional information, the present technology can be applied.

For example, as the technology for recording or distributing the acoustic signal with the relation to the positional information, such a technology is developed to enable expression over conventional surround generically called object audio, such as Dolby ATOMS (trademark) that is spread in the film field and MPEG 3D that is currently planned.

In general, regarding the contents, the individual sound volumes are adjusted to hear the sound matching a desired way of a sound engineer at a listening position assumed thereby. The above-adjusted contents are corrected as mentioned above, thereby enabling correction of acoustic sound more suitable for the listening position of the listener and further improving the realistic sense.

According to the present technology, it is possible to reduce an unnatural difference of sound recognition between persons on the sending side and the receiving side by restoring the relationship of the difference of the sound pressure between the sound sources, thereby enabling more realistic sense to be obtained.

Also, according to the present technology, even in a case where there is only one sound source on the sending side and a case where the sound source shifts or the listener shifts, by keeping the relationship of the difference of the sound pressure before/after the shift, it is possible to correctly keep shift sense of the sound source perceived on the receiving side and obtain more realistic sense.

Further, according to the present technology, different from the case of the wave field synthesis, a large number of speakers are not required. Therefore, introduction to users within a wide range is possible while suppressing costs.

Furthermore, according to the present technology, in a case of correcting the sound pressure on the sending side, even in a case of the existing acoustic communication system on the receiving side, it is possible to execute the acoustic communication and provide an acoustic effect with improvement in realistic sense.

<Recording Medium>

A series of processes described above can be executed by hardware or software. When a series of processes is executed by software, a program constituting the software is installed in a computer. Here, examples of the computer include a computer incorporated in dedicated hardware and a general-purpose personal computer which is capable of executing various kinds of functions when various kinds of programs are installed therein.

Figure 8:
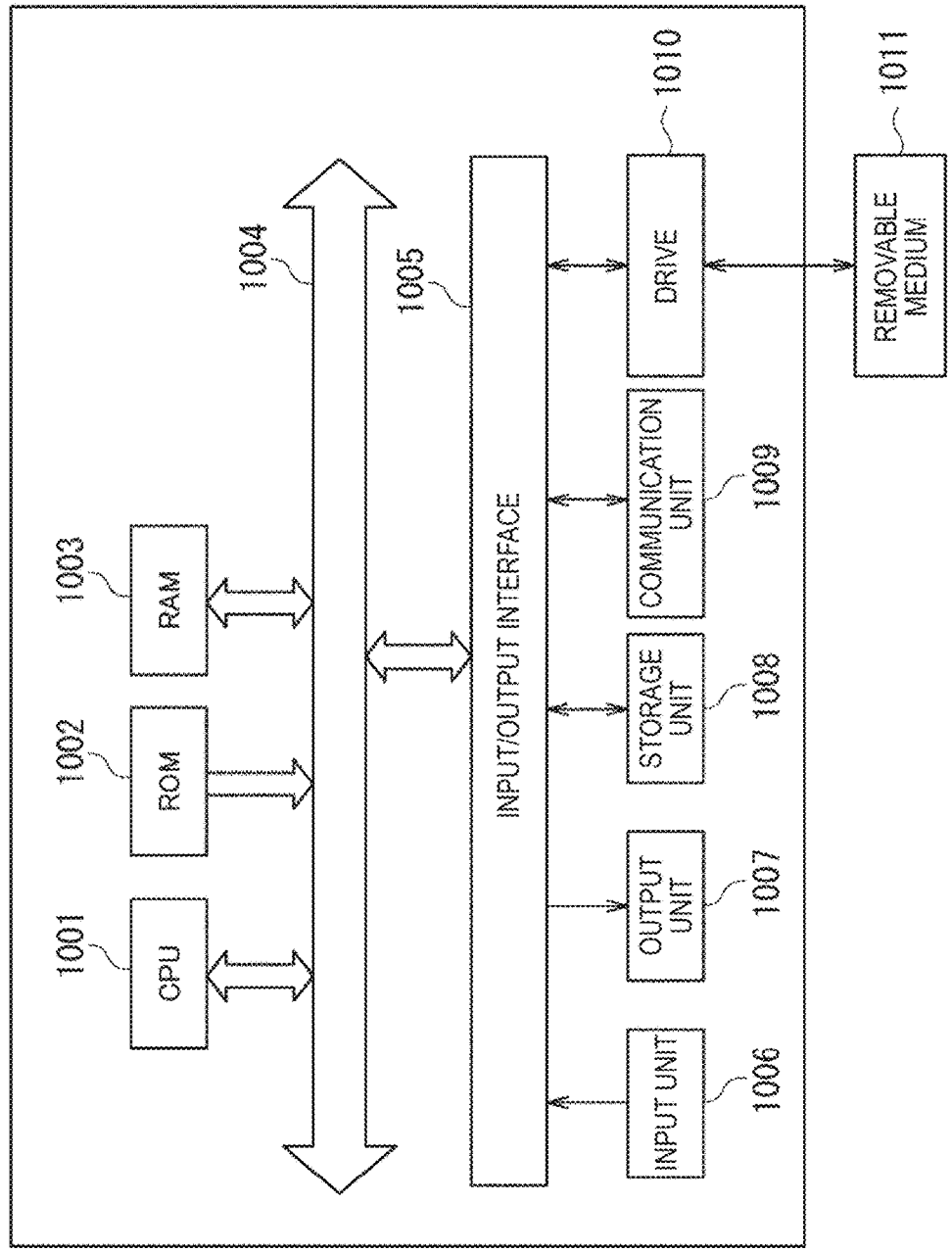
FIG. 8 is an illustration for explaining a recording medium.

FIG. 8 is a block diagram illustrating an exemplary hardware configuration of a computer that executes a series of processing described above by a program. In a computer, a central processing unit (CPU) 1001, a read only memory (ROM) 1002, and a random access memory (RAM) 1003 are connected to one another by a bus 1004. An input/output interface 1005 is further connected to the bus 1004. An input unit 1006, an output unit 1007, a storage unit 1008, a communication unit 1009, and a drive 1010 are connected to the input/output interface 1005.

The input unit 1006 includes a keyboard, a mouse, a microphone, or the like. The output unit 1007 includes a display, a speaker, or the like. The storage unit 1008 includes a hard disk, a nonvolatile memory, or the like. The communication unit 1009 includes a network interface or the like. The drive 1010 drives a removable medium 1011 such as a magnetic disk, an optical disk, a magneto-optical disk, or a semiconductor memory.

In the computer configured as described above, the CPU 1001 loads a program that is stored, for example, in the storage unit 1008 onto the RAM 1003 via the input/output interface 1005 and the bus 1004, and executes the program. Thus, the above-described series of processing is performed.

Programs to be executed by the computer (the CPU 1001) are provided being recorded in the removable medium 1011 which is a packaged medium or the like. Also, programs may be provided via a wired or wireless transmission medium, such as a local area network, the Internet or digital satellite broadcasting.

In the computer, by inserting the removable medium 1011 into the drive 1010, the program can be installed in the storage unit 1008 via the input/output interface 1005. Further, the program can be received by the communication unit 1009 via a wired or wireless transmission medium and installed in the storage unit 1008. Moreover, the program can be installed in advance in the ROM 1002 or the storage unit 1008.

It should be noted that the program executed by the computer may be a program that is processed in time series according to the sequence described in this specification or a program that is processed in parallel or at necessary timing such as upon calling.

Also, in this specification, the term "system" represents the totality of an apparatus composed of a plurality of apparatus.

Note that the effects described in the present specification are not limiting but are merely examples, and there may be additional effects.

Note that an embodiment of the disclosure is not limited to the embodiments described above, and various changes and modifications may be made without departing from the scope of the disclosure.

Additionally, the present technology may also be configured as below.

(1)

A signal processing device including:

an acoustic signal obtaining unit that obtains an acoustic signal;

a sound source positional information obtaining unit that obtains sound source positional information relating to a distance between a sound source and a sound collecting unit that collects sound from the sound source;

a listening positional information obtaining unit that obtains listening positional information relating to a distance between a reproducing device that reproduces the acoustic signal and a listener who listens to sound reproduced by the reproducing device; and a correcting unit that corrects gain of the acoustic signal on a basis of the sound-source positional information and the listening positional information.

(2)

The signal processing device according to (1), in which the correcting unit corrects the gain of the acoustic signal, thereby restoring a relationship of a difference of sound pressure between a plurality of sound sources.

(3)

The signal processing device according to (1) or (2), in which in a case where the distance shown by the sound-source positional information is a distance $r_1$ and the distance shown by the listening positional information is a distance $r_2$, the correcting unit multiplies the acoustic signal by $(r_1 \cdot r_2)/(r_1+r_2)$.

(4)

The signal processing device according to any of (1) to (3), in which the distance shown by the listening positional information has a fixed value.

(5)

The signal processing device according to any of (1) to (4), in which the acoustic signal obtaining unit obtains the acoustic signal via a network, and the sound-source positional information obtaining unit obtains the sound-source positional information via a network.

(6)

The signal processing device according to any of (1) to (4), in which the listening positional information obtaining unit obtains the listening positional information via a network.

(7)

The signal processing device according to any of (1) to (6), in which in a case where there is a plurality of listeners, the listening positional information is an average value of distances between of the respective listeners and the reproducing device, a distance to a listener existing at the closest position to the reproducing device among the plurality of the listeners, or a fixed value.

(8)

A signal processing method including steps of:

obtaining an acoustic signal;

obtaining sound-source positional information relating to a distance between a sound source and a sound collecting unit that collects sound from the sound source;

obtaining listening positional information relating to a distance between a reproducing device that reproduces the acoustic signal and a listener who listens to sound reproduced by the reproducing device; and correcting gain of the acoustic signal on a basis of the sound-source positional information and the listening positional information.

(9)

A program for causing a computer to execute processing including steps of:

obtaining an acoustic signal;

obtaining sound-source positional information relating to a distance between a sound source and a sound collecting unit that collects sound from the sound source;

obtaining listening positional information relating to a distance between a reproducing device that reproduces the acoustic signal and a listener who listens to sound reproduced by the reproducing device; and correcting gain of the acoustic signal on a basis of the sound-source positional information and the listening positional information.

(10)

A signal processing device including:

a sound collecting unit that collects sound from a sound source;

a distance measuring unit that measures a distance between the sound source and the sound collecting unit;

a listening positional information obtaining unit that obtains listening positional information relating to a distance between a reproducing device that reproduces an acoustic signal of the sound collected by the sound collecting unit and a listener who listens to sound reproduced by the reproducing device; and a correcting unit that corrects gain of the acoustic signal on a basis of the distance measured by the distance measuring unit and the distance shown by the listening positional information.

(11)

The signal processing device according to (10), in which the acoustic signal corrected by the correcting unit is supplied to the reproducing device.

(12)

The signal processing device according to (10) or (11), in which the sound collecting unit includes a microphone array, and the distance measuring unit calculates mutual correlation of sound collected by the microphone array, and measures a distance to the sound source by using a distance between microphones that collect sound with high correlation.

(13)

The signal processing device according to (10) or (11), in which the distance measuring unit analyzes an image obtained by capturing an image of the sound source and measures a distance to the sound source.

(14)

The signal processing device according to (10) or (11), in which the distance measuring unit measures a distance between the sound source and the sound collecting unit by using a GPS.

(15)

The signal processing device according to (10) or (11), in which the sound collecting unit includes a microphone that collects sound in proximity of the sound source, and the distance measuring unit sets a predetermined position as a reference, and measures a distance between the predetermined position and the microphone.

(16)

A signal processing method including steps of:
collecting sound form a sound source;
measuring a distance between the sound source and a sound collecting unit that collects the sound;
obtaining listening positional information relating to a distance between a reproducing device that reproduces an acoustic signal of the collected sound and a listener who listens to sound reproduced by the reproducing device; and
correcting gain of the acoustic signal on a basis of the measured distance and the distance shown by the listening positional information.

(17)

A program for causing a computer to execute processing including steps of:
collecting sound from a sound source;
measuring a distance between the sound source and a sound collecting unit that collects the sound;
obtaining listening positional information relating to a distance between a reproducing device that reproduces an acoustic signal of the collected sound and a listener who listens to sound reproduced by the reproducing device; and
correcting gain of the acoustic signal on a basis of the measured distance and the distance shown by the listening positional information.

REFERENCE SIGNS LIST 111, 112 sound source
113 sound collecting unit
114 distance measuring unit
115 sound source separating unit
121 reproduced sound source
122 listener
123 sound pressure correcting unit
124 distance measuring unit
201 sound pressure correcting unit
301 each-direction sound separating unit
302 switch
303 correlation calculating unit
304 adding unit
305 position calculating unit
401, 402 multiplying unit
403 adding unit
404 dividing unit
405 adding unit
406 multiplying unit
407 input unit

The invention claimed is:

1. A signal processing device comprising:
memory storing instructions:
a processor configured to implement the instructions to cause the signal processing device to:
obtain an acoustic signal;
obtain sound source positional information relating to a distance between a sound source and a sound collecting unit that collects sound from the sound source;
obtain listening positional information relating to a distance between a reproducing device that reproduces the acoustic signal and a listener who listens to sound reproduced by the reproducing device; and
correct a gain of the acoustic signal on a basis of the sound-source positional information and the listening positional information;
wherein in a case where the distance shown by the sound-source positional information is a distance $r_1$ and the distance shown by the listening positional information is a distance $r_2$, the processor multiplies the acoustic signal by $(r_1-r_2)/(r_1+r_2)$.

2. The signal processing device according to claim 1, wherein the processor is further configured to:
correct the gain of the acoustic signal, thereby restoring a relationship of a difference of sound pressure between a plurality of sound sources.

3. The signal processing device according to claim 1, wherein
the distance shown by the listening positional information has a fixed value.

4. The signal processing device according to claim 1, wherein the processor is further configured to:
obtain the acoustic signal via a network, and
obtain the sound-source positional information via a network.

5. The signal processing device according to claim 1, wherein the processor is further configured to:
obtain the listening positional information via a network.

6. The signal processing device according to claim 1, wherein
in a case where there is a plurality of listeners, the listening positional information is an average value of distances between of the respective listeners and the reproducing device, a distance to a listener existing at the closest position to the reproducing device among the plurality of the listeners, or a fixed value.

7. A signal processing method comprising steps of:
obtaining an acoustic signal;
obtaining sound-source positional information relating to a distance between a sound source and a sound collecting unit that collects sound from the sound source;
obtaining listening positional information relating to a distance between a reproducing device that reproduces the acoustic signal and a listener who listens to sound reproduced by the reproducing device; and
correcting gain of the acoustic signal on a basis of the sound-source positional information and the listening positional information;
wherein in a case where the distance shown by the sound-source positional information is a distance $r_1$ and the distance shown by the listening positional information is a distance $r_2$, the correcting multiplies the acoustic signal by $(r_1-r_2)/(r_1+r_2)$.

8. A non-transitory computer readable storage medium having computer readable instructions stored thereon that, when executed, cause a computer to execute processing comprising steps of:
obtaining an acoustic signal;
obtaining sound-source positional information relating to a distance between a sound source and a sound collecting unit that collects sound from the sound source;
obtaining listening positional information relating to a distance between a reproducing device that reproduces the acoustic signal and a listener who listens to sound reproduced by the reproducing device; and
correcting gain of the acoustic signal on a basis of the sound-source positional information and the listening positional information;
wherein in a case where the distance shown by the sound-source positional information is a distance $r_1$ and the distance shown by the listening positional information is a distance $r_2$, the correcting multiplies the acoustic signal by $(r_1-r_2)/(r_1+r_2)$.

9. A signal processing device comprising:
memory storing instructions:

a processor configured to implement the instructions to cause the signal processing device to:

collect sound from a sound source;

measure a distance between the sound source and the sound collecting unit;

obtain listening positional information relating to a distance between a reproducing device that reproduces an acoustic signal of the sound collected by the sound collecting unit and a listener who listens to sound reproduced by the reproducing device; and correct a gain of the acoustic signal on a basis of the measured distance and the distance shown by the listening positional information;

wherein in a case where the distance shown by the sound-source positional information is a distance $r_1$ and the distance shown by the listening positional information is a distance $r_2$, the processor multiplies the acoustic signal by $(r_1-r_2)/(r_1+r_2)$.

10. The signal processing device according to claim 9, wherein the corrected acoustic signal corrected is supplied to the reproducing device.

11. The signal processing device according to claim 9, wherein the sound collecting unit includes a microphone array, and the processor calculates mutual correlation of sound collected by the microphone array, and measures a distance to the sound source by using a distance between microphones that collect sound with high correlation.

12. The signal processing device according to claim 9, wherein the processor is further configured to:

analyze an image obtained by capturing an image of the sound source and measure a distance to the sound source.

13. The signal processing device according to claim 9, wherein the processor is further configured to:

measure a distance between the sound source and the sound collecting unit by using a GPS.

14. The signal processing device according to claim 9, wherein the sound collecting unit includes a microphone that collects sound in proximity of the sound source, and the processor sets a predetermined position as a reference, and measures a distance between the predetermined position and the microphone.

15. A signal processing method comprising steps of:

collecting sound form a sound source;

measuring a distance between the sound source and a sound collecting unit that collects the sound;

obtaining listening positional information relating to a distance between a reproducing device that reproduces an acoustic signal of the collected sound and a listener who listens to sound reproduced by the reproducing device; and correcting gain of the acoustic signal on a basis of the measured distance and the distance shown by the listening positional information;

wherein in a case where the distance shown by the sound-source positional information is a distance $r_1$ and the distance shown by the listening positional information is a distance $r_2$, the correcting multiplies the acoustic signal by $(r_1-r_2)/(r_1+r_2)$.

16. A non-transitory computer readable storage medium having computer readable instructions stored thereon that, when executed, cause a computer to execute processing comprising steps of:

collecting sound from a sound source;

measuring a distance between the sound source and a sound collecting unit that collects the sound;

obtaining listening positional information relating to a distance between a reproducing device that reproduces an acoustic signal of the collected sound and a listener who listens to sound reproduced by the reproducing device; and correcting gain of the acoustic signal on a basis of the measured distance and the distance shown by the listening positional information;

wherein in a case where the distance shown by the sound-source positional information is a distance $r_1$ and the distance shown by the listening positional information is a distance $r_2$, the correcting multiplies the acoustic signal by $(r_1-r_2)/(r_1+r_2)$.

* * * * *